US012694277B2

(12) United States Patent
Kim et al.

(10) Patent No.: US 12,694,277 B2
(45) Date of Patent: Jul. 28, 2026

(54) SYNAPTIC MECHANOTRANSISTORS

(71) Applicant: IUCF-HYU (INDUSTRY-UNIVERSITY COOPERATION FOUNDATION HANYANG UNIVERSITY), Seoul (KR)

(72) Inventors: Do Hwan Kim, Seoul (KR); Yoon Sun Chung, Seoul (KR); Joo Sung Kim, Seoul (KR); Hyuk Min Kweon, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 1105 days.

(21) Appl. No.: 17/607,066

(22) PCT Filed: Apr. 22, 2020

(86) PCT No.: PCT/KR2020/005268
§ 371 (c)(1),
(2) Date: Oct. 28, 2021

(87) PCT Pub. No.: WO2020/222455
PCT Pub. Date: Nov. 5, 2020

(65) Prior Publication Data

US 2022/0164640 A1 May 26, 2022

(30) Foreign Application Priority Data

Apr. 30, 2019 (KR) ........................ 10-2019-0050741

(51) Int. Cl.
*G06N 3/063* (2023.01)
*G01L 5/22* (2006.01)
(Continued)

(52) U.S. Cl.
CPC .............. *G06N 3/063* (2013.01); *G01L 5/228* (2013.01); *H10N 70/20* (2023.02); *H10W 20/051* (2026.01)

(58) Field of Classification Search
CPC ........ G06N 3/063; G01L 5/228; H10D 48/50; H10N 70/20
See application file for complete search history.

(56) References Cited

U.S. PATENT DOCUMENTS

| | | | | |
|---|---|---|---|---|
| 2002/0050611 A1 | 5/2002 | Yitzchaik et al. | | |
| 2008/0128684 A1* | 6/2008 | Kim | H10K 10/84 257/E51.024 | |

(Continued)

FOREIGN PATENT DOCUMENTS

| | | | |
|---|---|---|---|
| CN | 109473549 A | 3/2019 | |
| KR | 10-2016-0019682 A | 2/2016 | |

OTHER PUBLICATIONS

He et al., "Electric-double-layer transistors for synaptic devices and neuromorphic systems", Journal of Materials Chemistry C, May 11, 2018, pp. 1-17, [Retrieved on Nov. 5, 2018], (Year: 2018).*

(Continued)

*Primary Examiner* — Davienne N Monbleau
*Assistant Examiner* — Heim Kirin Grewal
(74) *Attorney, Agent, or Firm* — Sughrue Mion, PLLC

(57) ABSTRACT

A synaptic mechanotransistor includes an ionic active layer configured to form a channel through which migration of ions is provided. The synaptic mechanotransistor is capable of implementing a mechanical stimulus, a change in resistance of a sensor device, conversion into an electrical pulse signal, and securement of synaptic characteristics in a single device.

8 Claims, 4 Drawing Sheets

(51) Int. Cl.

*H10N 70/20* (2023.01)
*H10W 20/00* (2026.01)

(56) References Cited

U.S. PATENT DOCUMENTS

| | | | | |
|---|---|---|---|---|
| 2017/0018724 | A1* | 1/2017 | Tsuyama | C07D 497/14 |
| 2017/0176380 | A1* | 6/2017 | Borini | H10D 30/00 |
| 2018/0292279 | A1* | 10/2018 | Chen | H10B 63/80 |
| 2019/0049321 | A1* | 2/2019 | Kim | G01L 5/165 |

OTHER PUBLICATIONS

Yeongin Kim et al., "A bioinspired flexible organic artificial afferent nerve", Science, Jun. 1, 2018, pp. 1-34. (Year: 2018).*

Yongli He et al., "Electric-double-layer transistors for synaptic devices and neuromorphic systems", Journal of Materials Chemistry C, May 11, 2018, pp. 1-17, [Retrieved on Jul. 9, 2020], Retrieved from <URL: https://pubs.rsc.org/en/content/articlelanding/2018/tc/c8tc00530c>.

Yeongin Kim et al., "A bioinspired flexible organic artificial afferent nerve", Science, Jun. 1, 2018, pp. 1-34, [Retrieved on Jul. 9, 2020], Retrieved from <URL: https://science.sciencemag.org/content/360/6392/998/tab-pdf>, <DOI: 10.1126/science.aao0098>.

Office Action of Korean Application No. 10-2019-0050741 dated Apr. 29, 2020.

Notice of Allowance of Korean Application No. 10-2019-0050741 dated Oct. 30, 2020.

International Search Report of PCT/KR2020/005268 dated Jul. 29, 2020 [PCT/ISA/210].

* cited by examiner

【FIG. 1】
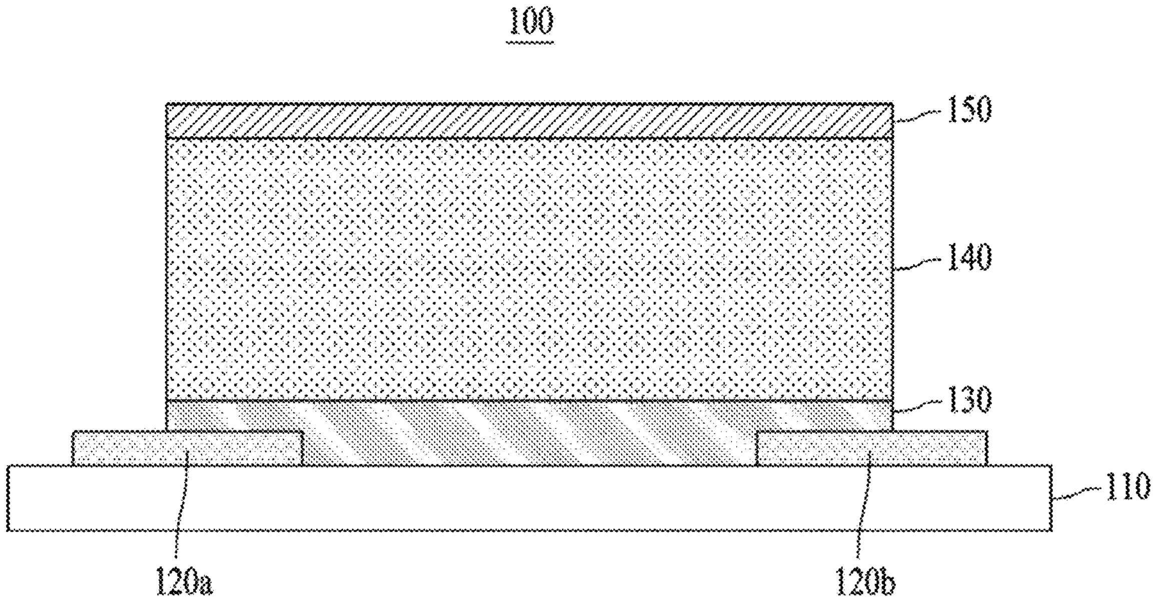
【FIG. 2】
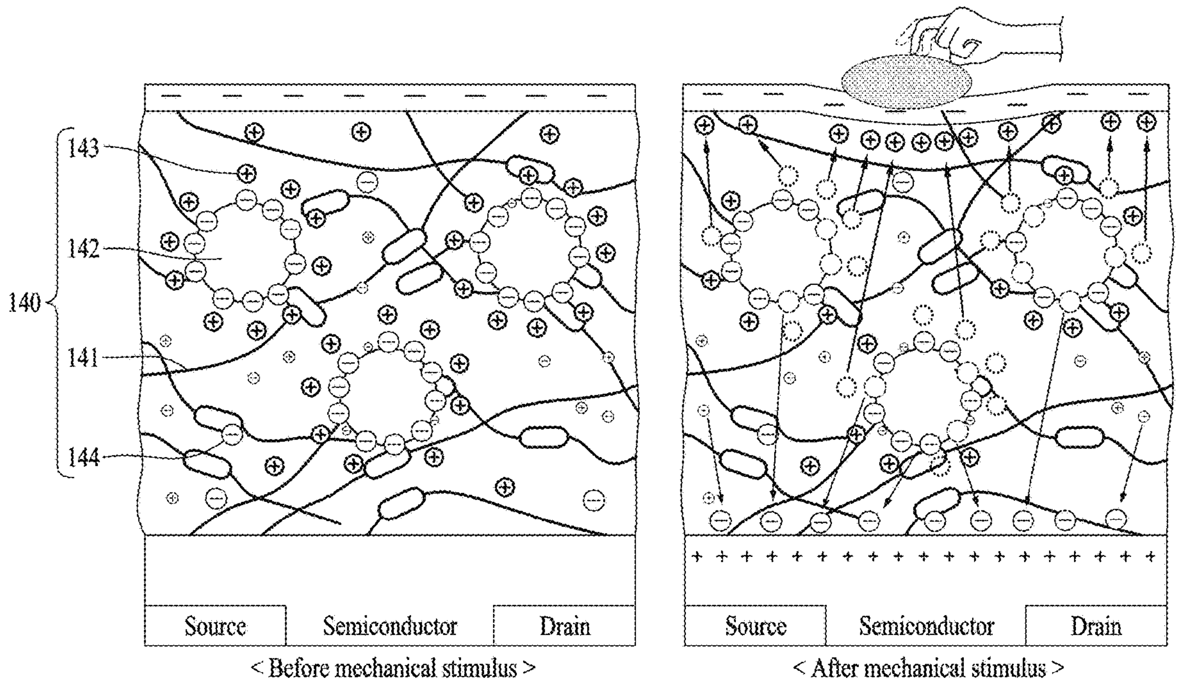

【FIG. 3】
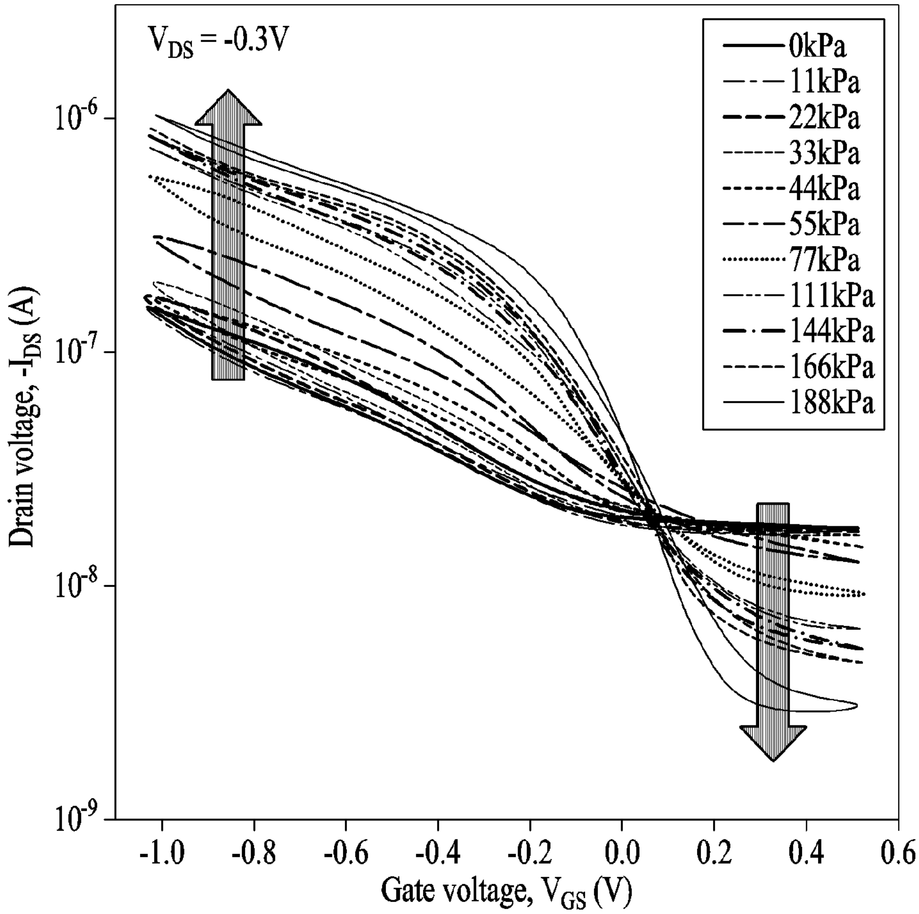

【FIG. 4】
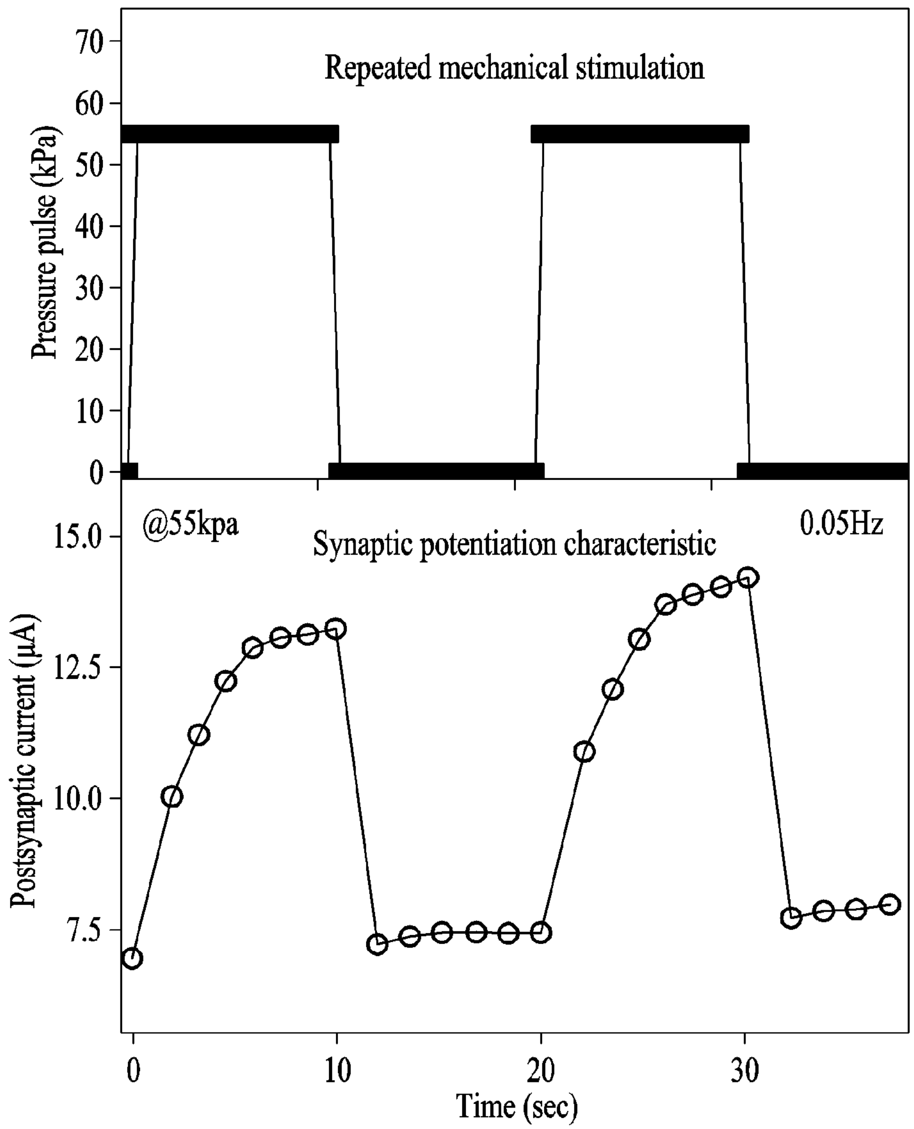

【FIG. 5】
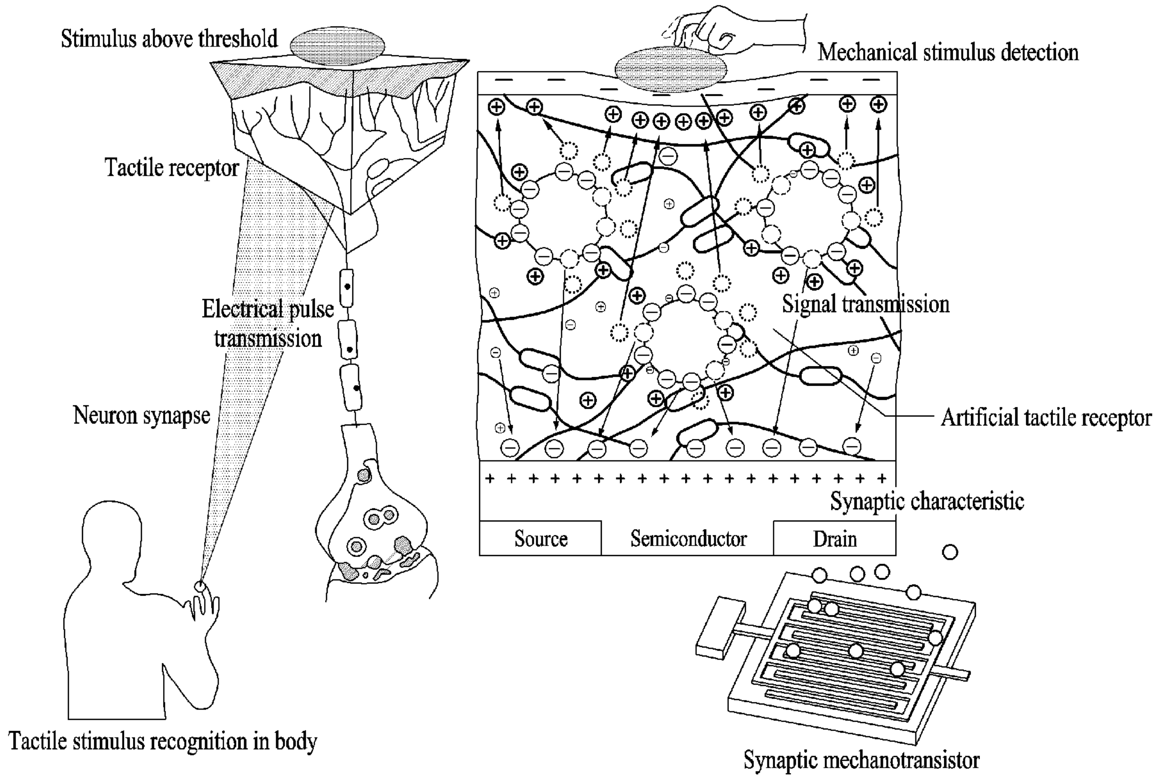
Stimulus above threshold
Tactile receptor
Electrical pulse transmission
Neuron synapse
Tactile stimulus recognition in body
Mechanical stimulus detection
Signal transmission
Artificial tactile receptor
Synaptic characteristic
Source     Semiconductor     Drain
Synaptic mechanotransistor

SYNAPTIC MECHANOTRANSISTORS

CROSS REFERENCE TO RELATED APPLICATIONS

This application is a National Stage of International Application No. PCT/KR2020/005268, filed Apr. 22, 2020, claiming priority to Korean Patent Application No. 10-2019-0050741, filed Apr. 30, 2019, the contents of all of which are incorporated herein by reference in their entirety.

TECHNICAL FIELD

The present invention relates to a synaptic mechanotransistor, and more particularly, a synaptic mechanotransistor that includes an ionic active layer capable of performing reversible ion mobility change according to external mechanical stimuli, and thus, is capable of realizing synaptic characteristics by external mechanical stimuli in a single device.

BACKGROUND ART

The nervous system of the body is composed of numerous nerve cells and neurons, and the neurons are connected by synapses.

Accordingly, an external stimulus is converted into an electrical signal in the body, which transmits a signal to each nervous system in the form of an action potential through neurons An action potential generated in a presynaptic neuron becomes a small post-synaptic potential when passes through a synapse, and an action potential is transmitted in a manner that a new action potential is generated in an axon hillock of a post-synaptic neuron when multiple post-synaptic potentials are integrated and exceed a certain value (threshold).

In the case of existing artificial synaptic device research that mimics the tactile recognition process through known neural circuits, artificial afferent neural circuits are implemented by connecting devices with independent functions in parallel.

That is, artificial synaptic devices for tactile recognition up to now are composed of a pressure sensor for tactile recognition stimulation, a transducer for transmitting an external stimulus signal as an electrical signal, and a synaptic transistor device expressing neuronal synaptic characteristics and are operated.

A stimulus received through a pressure sensor passes through a transducer and is transferred to a synaptic transistor device as a voltage in the form of a spike. Accordingly, the transistor device exhibits synaptic characteristics.

However, in the case of an artificial synaptic device in which several devices are connected in parallel, a complicated signal processing process, which includes mechanical stimulation→resistance change in a sensor device→conversion into an electrical pulse signal→transmission to a synaptic device→securement of synaptic characteristics, is inevitably included:.

In addition, since all devices should be connected in parallel, it is difficult to secure resolution for effective tactile recognition, and a device manufacturing process is very complicated.

Such an existing technology cannot be regarded as imitating the actual tactile recognition process, which appears as a complex action of the intensity and frequency of stimuli, because it is impossible to recognize the frequency of mechanical stimuli.

RELATED ART DOCUMENTS

Patent Documents (Patent Document 1) Korean Patent Application Publication No. 10-2018-0107923, "Graphene device in improved drain current saturation and voltage gain"

(Patent Document 2) Korean Patent Application Publication No. 10-2017-0094887, "Metal halide perovskite synapse device"

(Patent Document 3) Korean Patent No. 10-1874187, "Memristor device of performing conditioned response and method of driving the same"

DISCLOSURE

Technical Problem

Therefore, the present invention has been made in view of the above problems, and it is one object of the present invention to provide a synaptic mechanotransistor, and more particularly, a synaptic mechanotransistor that includes an ionic active layer capable of performing reversible ion mobility change according to mechanical stimuli, and thus, is capable of realizing synaptic characteristics by external mechanical stimuli in a single device.

Technical Solution

In accordance with an aspect of the present invention, the above and other objects can be accomplished by the provision of a synaptic mechanotransistor, including: a substrate; a source electrode and drain electrode formed the substrate; a semiconductor channel layer formed on the substrate and configured to be in electrical contact with the source electrode and the drain electrode; an ionic active layer formed on the semiconductor channel layer; and a gate electrode formed on the ionic active layer, wherein a channel is formed in the ionic active layer through ion migration by an external mechanical stimulus.

In the synaptic mechanotransistor according to an embodiment of the present invention, the ionic active layer may include a polymer resin, hydrogen-bonded particles, and an ionic liquid.

In the synaptic mechanotransistor according to an embodiment of the present invention, the polymer resin may include at least one selected from the group consisting of a thermoplastic polyurethane (TPU) or polydimethylsiloxane (PDMS), polyisoprene, polybutadiene and polyisobutylene.

In the synaptic mechanotransistor according to an embodiment of the present invention, the hydrogen-bonded particles may include at least one selected from the group consisting of silica ($SiO_2$) particles, metal particles whose surfaces include a surface functional group capable of hydrogen bonding, and organic particles.

In the synaptic mechanotransistor according to an embodiment of the present invention, the ionic active layer may be in a state in which ions are constrained to a surface of the hydrogen-bonded particles through hydrogen bonding.

In the synaptic mechanotransistor according to an embodiment of the present invention, the mechanical stimulus may be pressure.

In the synaptic mechanotransistor according to an embodiment of the present invention, a migration amount of the ions may be changed depending upon a magnitude of the pressure.

In the synaptic mechanotransistor according to an embodiment of the present invention, the pressure magnitude may be 100 Pa to 200 kPa.

In the synaptic mechanotransistor according to an embodiment of the present invention, a migration amount of the ions may be changed depending upon a frequency of the pressure.

In the synaptic mechanotransistor according to an embodiment of the present invention, the pressure frequency may be 0.05 Hz to 15 Hz.

In the synaptic mechanotransistor according to an embodiment of the present invention, the synaptic mechanotransistor may have a potentiation characteristic or a depression characteristic with respect to the pressure.

Advantageous Effects

As apparent from the above description, the present invention provides a synaptic mechanotransistor that includes an ionic active layer configured to form a channel according to migration of ions, and thus, is capable of implementing a series of steps of a mechanical stimulus, change in resistance of a sensor device, conversion into an electrical pulse signal and securement of synaptic characteristics in a single device.

In addition, a synaptic mechanotransistor according to an embodiment of the present invention has the structure wherein ions are constrained to the surface of hydrogen-bonded particles inside the ionic active layer through hydrogen bonding, so that the migration of ions does not occur due to simple formation of an electric field, and synaptic characteristics can be secured when an external mechanical stimulus is applied,

DESCRIPTION OF DRAWINGS

FIG. 1 illustrates a synaptic mechanotransistor according to an embodiment of the present invention.

FIG. 2 illustrates the behavior of ions before and after application of external pressure of a synaptic dynamics transistor according to an embodiment of the present invention.

FIG. 3 illustrates a pressure-dependent current change characteristic of a synaptic mechanotransistor according to an embodiment of the present invention.

FIG. 4 illustrates a pressure-dependent plasticity of a synaptic mechanotransistor according to an embodiment of the present invention.

FIG. 5 is a diagram illustrating a comparison between a tactile recognition process in the body and a mechanical stimulus detection process of the synaptic mechanotransistor according to an embodiment of the present invention.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms “comprise” and/or “comprising”, when used in this specification, specify the presence of stated components, steps, operations, and/or elements, but do not preclude the presence or addition of one or more other components, steps, operations, and/or elements thereof.

It should not be understood that arbitrary aspects or designs disclosed in “embodiments”, “examples”, “aspects”, etc. used in the specification are more satisfactory or advantageous than other aspects or designs.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as “first” and “second” are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being “on” another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Hereinafter, a synaptic transistor according to an embodiment of the present invention is described in detail with reference to the accompanying drawings.

FIG. 1 illustrates a synaptic mechanotransistor according to an embodiment of the present invention.

Referring to FIG. 1, a synaptic mechanotransistor 100 according to an embodiment of the present invention includes a substrate 110, a source electrode **120*a* and drain electrode 120*b* formed on the substrate 110, a semiconductor channel layer 130 formed on the substrate 110 and formed to be in electrical contact with the source and drain electrodes 120*a* and 120*b*, an ionic active layer 140 formed on the semiconductor channel layer 130 and a gate electrode 150 formed on the ionic active layer 140**.

The synaptic mechanotransistor shown in FIG. 1 has a top-gate/bottom-contact structure, but the structure thereof is not limited thereto. The synaptic mechanotransistor may have a top-gate/top-contact, a bottom-gate/bottom-contact, or a bottom-gate/top-contact.

The substrate 110 may include at least one selected, without being limited to, from the group consisting of an insulating material, a metal material, a carbon material, a semiconductor, and a composite material of a conductor and an insulating film.

The source and drain electrodes 120*a* and 120*b* formed on the substrate 110 may include at least one metal material selected from the group consisting of aluminum, copper, nickel, iron, chromium, titanium, zinc, lead, gold, and silver, may include a conductive polymer material such as poly(3,4-ethylenedioxythiophene):polystyrene sulfonate (PEDOT:PSS), and may include a doped polymer material.

In addition, The source and drain electrodes 120*a* and 120*b* may include at least one selected from the group consisting of Silver nanowires (AgNWs), carbon nanotube (CNT) and graphene.

In addition, the source and drain electrodes 120*a* and 120*b* may be formed from a surface of the substrate 110 through an ion implantation process.

The semiconductor channel layer 130 formed to be in electrical contact with the source and drain electrodes 120*a* and 120*b* is a layer in which electrons and holes move for device operation, and may be formed of a low-molecular-weight organic semiconductor, an organic semiconductor, a conductive polymer, an inorganic semiconductor, an oxide semiconductor, a two-dimensional semiconductor, or quantum dots.

Here, the aforementioned low-molecular-weight organic semiconductor may include at least one selected from the group consisting of 6,13-bis (triisopropylsilylethynyl) (TIPS) pentacene, triethylsilylethynyl anthradithiophene (TES ADT) and [6,6]-Phenyl C61 butyric acid methyl ester (PCBM), the aforementioned inorganic semiconductor or conductive polymer may include at least one selected from the group consisting of poly(3-hexylthiophene) (P3HT), poly(3,4-ethylenedioxythiophene) (PEDOT), poly(9-vinylcarbazole) (PVK), poly(p-phenylene vinylene), polyfluorene, polyaniline, and polypyrrole, the aforementioned inorganic semiconductor may include at least one selected from the group consisting of silicon, germanium, gallium arsenide, carbon nanotubes (CNT), reduced graphene oxide, graphene, graphene quantum dots, and graphite, the aforementioned inorganic oxide semiconductor may include at least one selected from the group consisting of zinc oxide, tin oxide, indium oxide, zinc tin oxide (ZTO), indium zinc oxide (IZO), and indium zinc gallium oxide (IGZO), the aforementioned two-dimensional semiconductor material may include at least one selected from the group consisting of molybdenum sulfide ($MoS_2$), tungsten sulfide ($WS_2$), molybdenum selenide ($MoSe_2$), tungsten selenide ($WSe_2$), boron nitride (h-BN), and fluoro-graphene, and the aforementioned quantum dots may include at least one selected from the group consisting of cadmium selenide, cadmium telluride, and cadmium sulfide.

The semiconductor channel layer 130 may be formed using a deposition process such as physical vapor deposition (PVD), chemical vapor deposition (CVD), sputtering, pulsed laser deposition (PLD), thermal evaporation, electron beam evaporation, atomic layer deposition (ALD) or molecular beam epitaxy (MBE), or a solution process such as spin coating, dip coating, spray coating, bar coating, or screen printing, but may be formed using an appropriate process selected depending upon the type of a manufactured channel layer, without being limited to a specific process.

The ionic active layer 140 is a layer configured to form a channel through ion migration by external pressure.

The ionic active layer 140 has a structure including a polymer resin, hydrogen-bonded particles, and an ionic liquid.

The polymer resin may include at least one selected from the group consisting of thermo plastic polyurethane (TPU), polydimethylsiloxane (PDMS), polyisoprene, polybutadiene, Styrene-ethylene-butylene-styrene (SEBS), poly(vinylidene fluoride-hexafluoropropylene) (PVdF-HFP) and polyisobutylene.

In addition, the hydrogen-bonded particles are not limited so long as the surface of the particles is capable of hydrogen-bonding with ions, and may include, for example, silica ($SiO_2$) particles, metal particles (gold, silver, copper, platinum, etc.) whose surfaces include a surface functional group capable of hydrogen bonding, or organic particles.

An ionic liquid constituting the ionic active layer 140 is a salt that exists in a liquid state at room temperature and consists only of ions. Accordingly, the ionic active layer 140 has a high conductivity of about 10 mS/cm, a wide electrochemical window of 4 V or higher, and very low volatility. In addition, the viscosity of anionic liquid may be similar to or higher than that of water.

The ionic active layer 140 may have a state in which ions in the ionic liquid are confined to the surface of the hydrogen-bonded particles through hydrogen bonding.

Any one ion type of cations and anions contained in the ionic liquid may be bonded to the surface of hydrogen-bonded particles through hydrogen bonding, and the other may be bonded by electrostatic attraction.

For example, when anions contained in the ionic liquid are boned to the surface of the hydrogen-bonded particles through hydrogen bonding, cations included in the ionic liquid may have a structure of being bonded to the periphery of the anions by electrostatic attraction.

Accordingly, cation and anions are paired to form an ionic double layer on the surface of the hydrogen-bonded particles.

As described above, the ionic active layer 140 forms a channel through migration of ions by external pressure. Here, migration of ions occurs according to pressure applied from the outside.

In addition, the amount of moving ions may be changed according to the magnitude of the pressure applied from the outside.

Here, the magnitude of external pressure may be 100 Pa to 200 kPa.

When the magnitude of external pressure is less than 100 Pa, the hydrogen bonding between hydrogen-bonded particles and ions inside the ionic active layer is not broken, so that migration of the ions does not flow.

In addition, when the magnitude of external pressure exceeds 200 kPa, hydrogen bonding inside the ionic active layer is mostly broken, so that it is difficult to effectively sense pressure.

Additionally, an migration amount of the ions may be changed according to the frequency of external pressure.

Here, the frequency of external pressure may be 0.05 Hz to 15 Hz.

The gate electrode 150 of the synaptic mechanotransistor 100 according to an embodiment of the present invention may be made of at least one metal material selected from the group consisting of aluminum, copper, nickel, iron, chromium, titanium, zinc, lead, gold, and silver, may be made of a conductive polymer material such as poly(3,4-ethylenedioxythiophene):polystyrene sulfonate (PEDOT:PSS), or may be made of a doped polymer material, without being limited thereto.

In addition, The gate electrode 150 may include at least one selected from the group consisting of Silver nanowires (AgNWs), carbon nanotube (CNT) and graphene.

The synaptic mechanotransistor according to an embodiment of the present invention having the aforementioned structure has a synaptic characteristic of a potentiation characteristic or a depression characteristic with respect to external pressure.

More particularly, when an application frequency of external pressure is gradually increased so that an application time of the external pressure becomes faster than a recovery time of ions, the synaptic mechanotransistor according to an embodiment of the present invention may exhibit an adaptive characteristic wherein a current characteristic is constantly maintained at a specific frequency or more.

In addition, the same adaptation characteristic may be exhibited also when the intensity of the external pressure applied is gradually increased.

Accordingly, the synaptic mechanotransistor according to an embodiment of the present invention may exhibit synaptic potentiation or depression characteristics, adaptive characteristics, long-term and short-term memory characteristics, and the like.

In addition, when a conductive polymer, such as poly(3,4-ethylenedioxythiophene):polystyrene sulfonate (PEDOT:PSS), in which an electric charge is formed in an initial state, is used as a semiconductor layer, depression characteristics, adaptive characteristics, and long-term and short-term memory characteristics may be exhibited.

As described above, the synaptic mechanotransistor according to an embodiment of the present invention has the form wherein cations and anions are constrained in the surface of hydrogen-bonded particles inside the ionic active layer through hydrogen bonding, so that simple formation of an electric field does not cause migration of ions, and synaptic characteristics are secured only when an external mechanical stimulus such as pressure is additionally applied.

Accordingly, a channel may be formed in response to an external mechanical stimulus, thereby exhibiting plasticity properties, thereby having an advantage in that a series of steps of mechanical stimulation, change in resistance of a sensor element, conversion into an electrical pulse signal, and securement of synaptic characteristics may be implemented in a single device. Hereinafter, the synaptic mechanotransistor according to an embodiment of the present invention is described in more detail with reference to FIGS. 2 to 5.

FIG. 2 illustrates the behavior of ions before and after application of external pressure of a synaptic dynamics transistor according to an embodiment of the present invention.

A ionic active layer 140 of the synaptic mechanotransistor according to an embodiment of the present invention has a structure including a polymer resin 141, hydrogen-bonded particles 142 and an ionic liquid.

In addition, the ionic liquid includes cations 143 and anions 144.

As an embodiment, when the polymer resin is a thermoplastic polyurethane, Formula 1 below illustrates an example of an ionic active layer.

[Formula 1]

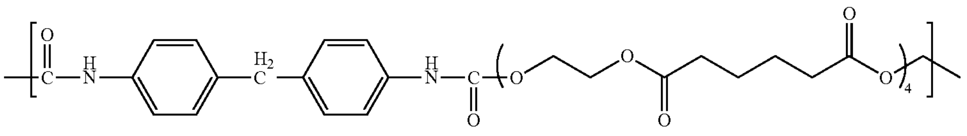

In addition, Formula 2 below illustrates an example of the cations (EMIM+) 143 included in the ionic liquid, and Formula 3 below illustrates an example of the anions (TFSI−) 144 included in the ionic liquid.

[Formula 2]

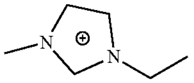

[Formula 3]

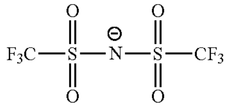

Referring to the left drawing of FIG. 2, the anions 144 inside the ionic active layer 140 are hydrogen-bonded to the surface of the hydrogen-bonded particles 142 before applying pressure to the synaptic mechanotransistor according to an embodiment of the present invention.

Here, the cations 143 inside the ionic active layer 140 are constrained to the periphery of the hydrogen-bonded particles 142 by electrostatic attraction with the anions 144 hydrogen-bonded thereto, thereby having an ionic double-layer structure.

This is due to the —OH group formed the surface of the hydrogen-bonded particles 142. For example, when the hydrogen-bonded particles 142 is silica, a hydrogen having an —OH group formed the surface of the silica is hydrogen-bonded (H—F) to fluorine as an anion.

As described above, when the anions 144 inside the ionic active layer 140 are constrained to the surface of the hydrogen-bonded particles 142 through hydrogen bonding, the anions 144 maintain the constrained state and do not move even when an electric field is applied to the synaptic mechanotransistor 100 according to an embodiment of the present invention through the gate electrode 150.

Referring to the synaptic mechanotransistor according to FIG. 2, the gate electrode 150 is negatively charged due to application of an electric field.

On the other hand, referring to the right drawing of FIG. 2, stress according to pressure is concentrated on the electric double layer to break the hydrogen bond when the pressure is applied to the synaptic mechanotransistor 100 according to an embodiment of the present invention.

In other words, when pressure is applied to the synaptic mechanotransistor 100 according to an embodiment of the present invention, ions are in a state in which they can freely move, and the freely movable ions move according to an electric field.

More particularly, the cations 143 move to and concentrated on the negatively charged gate electrode 150, thereby forming an electrical double layer.

In addition, the anions 144 move to the semiconductor channel layer due to an electric field by the migration of the cations 143 to the gate electrode 150, thereby forming an electrical double layer.

More particularly, that is because the cations 143 are collected to the gate electrode 150 by the electric field applied to the gate, and the anions 144 move to the semiconductor channel layer opposite to the gate electrode to achieve electrical equilibrium.

As such, when an electrical double layer is formed on an interface between the gate electrode 150 and the ionic active layer 140 and an interface between the semiconductor channel layer 130 and the ionic active layer 140, ions concentrated on each of the interfaces increase depending upon the intensity of externally applied pressure or strain, a stimulation frequency, and a stimulation duration, and such ion accumulation enables the realization of synaptic characteristics.

FIG. 3 illustrates a pressure-dependent current change characteristic of a synaptic mechanotransistor according to an embodiment of the present invention.

Referring to FIG. 3, it can be confirmed that channels in an ionic active layer are depleted or accumulated while reversible mobility of cations and anions is changed according to an applied pressure, so that a current value of the channels is changed.

More particularly, it can be confirmed that the amount of ions accumulated on a semiconductor channel layer of the synaptic mechanotransistor according to an embodiment of the present invention increases with increasing intensity of applied pressure and, accordingly, the characteristics of transistor are exhibited while hole charges of the semiconductor channel layer are accumulated.

FIG. 4 illustrates a pressure-dependent plasticity of a synaptic mechanotransistor according to an embodiment of the present invention.

Referring to FIG. 4, it can be confirmed that the plasticity of the synaptic mechanotransistor according to an embodiment of the present invention is realized depending upon the intensity, frequency, and duration of pressure applied from the outside.

The conditions of data shown in FIG. 4 are as follows: a pressure of 55 kPa is repeatedly applied and removed every 10 s. Here, a frequency is 0.05 Hz.

More particularly, ions is accumulated in a larger amount than in an initial stimulation stage when a pressure of 55 kPa is repeatedly applied and removed every 10 s, so that a synaptic potentiation characteristic wherein current increases during next stimulation can be confirmed.

In addition, when the intensity, frequency, and duration of pressure applied from the outside is changed, it is predicted that only the absolute value of the current indicated by the graph is changed, and the behavior and potentiation characteristics of the graph appear the same.

FIG. 5 is a diagram illustrating a comparison between a tactile recognition process in the body and a mechanical stimulus detection process of the synaptic mechanotransistor according to an embodiment of the present invention.

The tactile recognition process of the body consists of a system wherein an electrical pulse is transmitted through an afferent nerve when a stimulus greater than a threshold is applied, and the brain recognizes the electrical pulse through the synapse of the neuron.

Existing synaptic devices being studied so far have a structure wherein a sensor for recognizing a stimulus, a transducer for transmitting an electrical signal, and a transistor device in which synaptic characteristics are expressed are respectively connected in parallel, thus being not considered as one which completely imitates the tactile recognition process of the body.

However, the synaptic characteristics of the synaptic mechanotransistor according to an embodiment of the present invention are expressed by a mechanical stimulus such as pressure, unlike existing synaptic transistor devices stimulated by an electrical pulse, which induces ion migration inside an ionic active layer by pressure (stimulus recognition). Accordingly, the characteristic that the electrical characteristics of channels formed inside the ionic active layer are changed is implemented in a single device.

More particularly, since the synaptic mechanotransistor according to an embodiment of the present invention has the structure wherein cations and anions are constrained to the surface of hydrogen-bonded particles inside an ionic active layer through hydrogen bonding, the migration of ions does not occur due to simple formation of an electric field, and synaptic characteristics can be secured when an external mechanical stimulus such as pressure is additionally applied.

Accordingly, channels are formed according to an external mechanical stimulus, thereby exhibiting plasticity. Accordingly, a series of steps of a mechanical stimulus, change in resistance of a sensor device, conversion into an electrical pulse signal and securement of synaptic characteristics can be implemented in a single device. Therefore, the synaptic mechanotransistor according to an embodiment of the present invention effectively mimics the tactile recognition process of the body.

Meanwhile, embodiments of the present invention disclosed in the present specification and drawings are only provided to aid in understanding of the present invention and the present invention is not limited to the embodiments. It will be apparent to those skilled in the art that various modifications can be made to the above-described exemplary embodiments of the present invention without departing from the spirit and scope of the invention.

The invention claimed is:

1. A synaptic mechanotransistor, comprising:

a substrate;

a source electrode and a drain electrode formed on the substrate;

a semiconductor channel layer formed on the substrate and configured to be in electrical contact with the source electrode and the drain electrode;

an ionic active layer formed on the semiconductor channel layer; and a gate electrode formed on the ionic active layer, wherein the ionic active layer comprises a polymer resin, hydrogen-bonded particles, and an ionic liquid, wherein the polymer resin comprises at least one selected from the group consisting of a thermoplastic polyurethane (TPU) or polydimethylsiloxane (PDMS), polyisoprene, polybutadiene and polyisobutylene, wherein mobile ions in the ionic liquid are physically constrained on the surfaces of the hydrogen-bonded particles by hydrogen bonding in the absence of any external mechanical stimulus, wherein migration of the mobile ions does not occur due to formation of an electric field alone; and wherein an ion migration pathway in the ionic active layer is formed only when the hydrogen bonding is broken by the external mechanical stimulus to thereby enable migration of the mobile ions.

2. The synaptic mechanotransistor according to claim 1, wherein the hydrogen-bonded particles comprises at least one selected from the group consisting of silica ($SiO_2$) particles, metal particles whose surfaces comprise a surface functional group capable of hydrogen bonding, and organic particles.

3. The synaptic mechanotransistor according to claim 1, wherein the mechanical stimulus is pressure.

4. The synaptic mechanotransistor according to claim 3, wherein a migration amount of the ions is changed depending upon a magnitude of the pressure.

5. The synaptic mechanotransistor according to claim 4, wherein the pressure magnitude is 100 Pa to 200 kPa.

6. The synaptic mechanotransistor according to claim 3, wherein a migration amount of the ions is changed depending upon a frequency of the pressure.

7. The synaptic mechanotransistor according to claim 6, wherein the pressure frequency is 0.05 Hz to 15 Hz.

8. The synaptic mechanotransistor according to claim 3, wherein the synaptic mechanotransistor has a potentiation characteristic or a depression characteristic with respect to the pressure.

* * * * *